United States Patent
Li et al.

(10) Patent No.: US 7,390,752 B2
(45) Date of Patent: Jun. 24, 2008

(54) SELF-ALIGNING PATTERNING METHOD

(75) Inventors: Shunpu Li, Cambridge (GB); Thomas Kugler, Cambridge (GB); Christopher Newsome, Cambridge (GB); David Russell, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 11/253,756

(22) Filed: Oct. 20, 2005

(65) Prior Publication Data
US 2006/0128076 A1 Jun. 15, 2006

(30) Foreign Application Priority Data
Dec. 9, 2004 (GB) .................. 0427035.1

(51) Int. Cl.
*H01L 21/302* (2006.01)
(52) U.S. Cl. ............... 438/723; 438/719; 438/720; 438/745
(58) Field of Classification Search .......... 438/694, 438/703, 706, 710, 717, 719, 720, 723, 724, 438/725, 745, 756
See application file for complete search history.

(56) References Cited

U.S. PATENT DOCUMENTS

| | | | | |
|---|---|---|---|---|
| 4,704,784 A | | 11/1987 | Szydlo et al. | |
| 5,235,189 A | * | 8/1993 | Hayden et al. | 257/329 |
| 5,719,078 A | | 2/1998 | Kim | |
| 5,739,067 A | * | 4/1998 | DeBusk et al. | 438/618 |
| 5,844,254 A | * | 12/1998 | Manning et al. | 257/67 |
| 6,049,093 A | * | 4/2000 | Manning et al. | 257/67 |
| 6,433,359 B1 | * | 8/2002 | Kelley et al. | 257/40 |
| 6,803,263 B1 | * | 10/2004 | Lin et al. | 438/149 |
| 2003/0222312 A1 | * | 12/2003 | Breen et al. | 257/347 |
| 2004/0214378 A1 | * | 10/2004 | Lin et al. | 438/149 |
| 2005/0045889 A1 | * | 3/2005 | Fryer et al. | 257/72 |
| 2006/0068563 A1 | * | 3/2006 | Wong et al. | 438/455 |

FOREIGN PATENT DOCUMENTS

EP 0 449 404 10/1991

* cited by examiner

*Primary Examiner*—Kin-Chan Chen
(74) *Attorney, Agent, or Firm*—Oliff & Berridge, PLC

(57) ABSTRACT

The present invention relates to a self-aligning patterning method which can be used to manufacture a plurality of multi-layer thin film transistors on a substrate.

Figure 1:
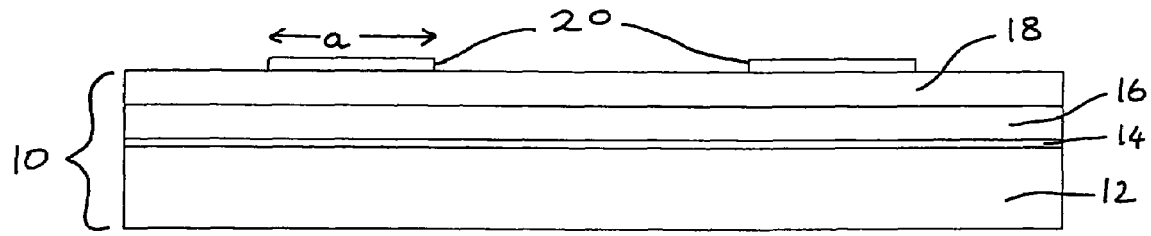
Figure 1:
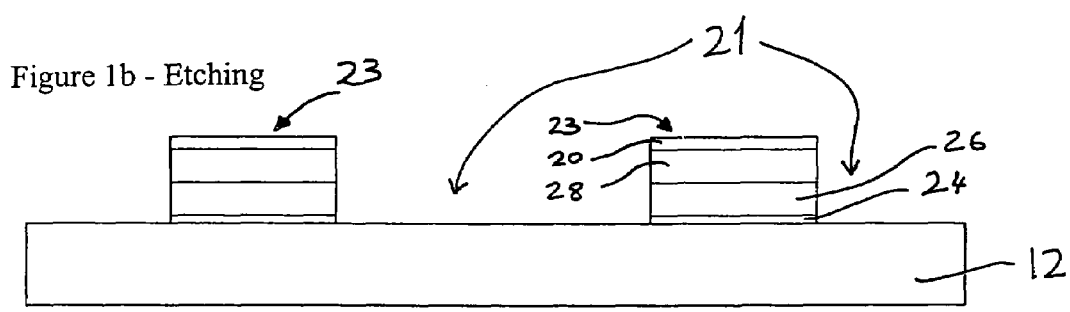
Figure 1:
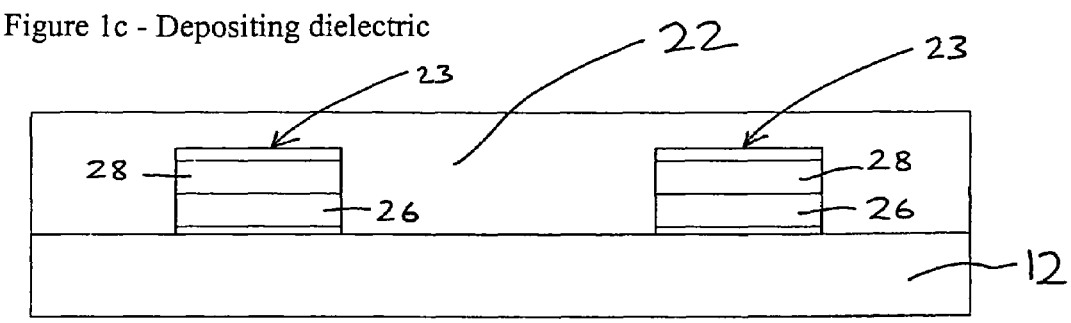
Figure 1:
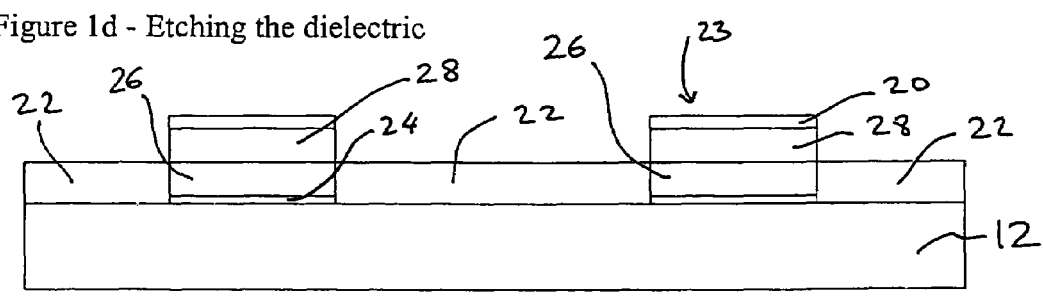
Figure 1:
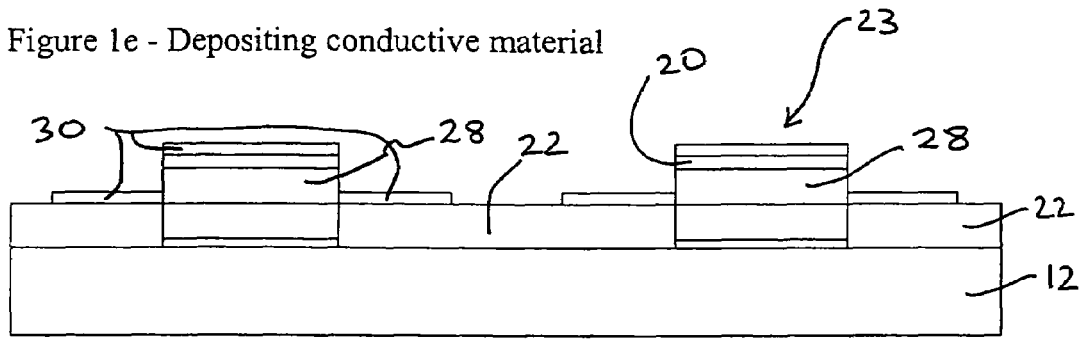
Figure 1:
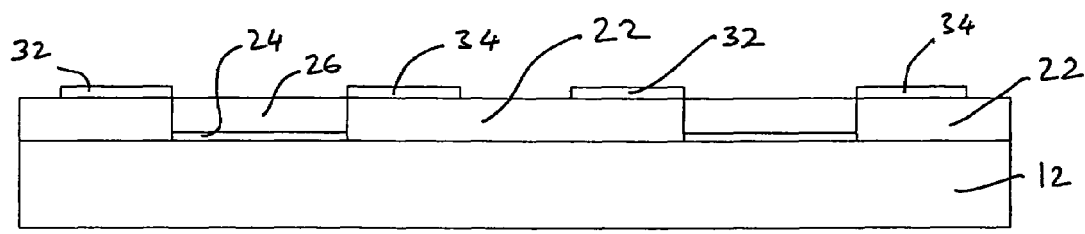
Figure 1:
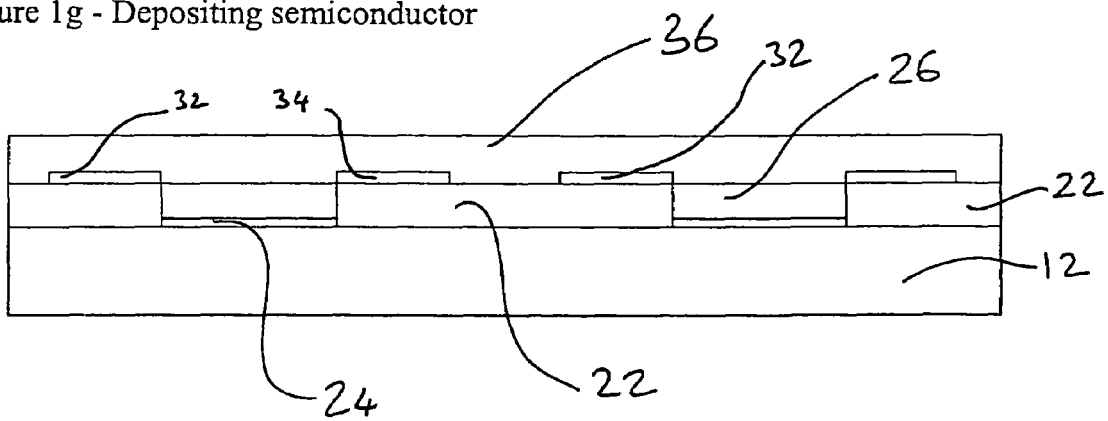

The method comprises firstly forming a patterned mask 20 on the surface of a sacrificial layer 18 which is part of a multi-layer structure 10 which comprises the substrate 12, a conductive layer 14, an insulating layer 16 and the sacrificial layer 18. Unpatterned areas are then etched to remove the corresponding areas of the sacrificial layer, the insulating layer 16 and the conductive layer 14 thereby leaving voids. A layer of dielectric 22 is then deposited over the etched multi-layer structure to at least substantially fill the voids. The deposited dielectric is then etched in order to at least partially expose the sides of the remaining areas 28 of the sacrificial layer. Conductive material 30 is then deposited on the surface of the etched dielectric. Finally, the remaining areas 28 of the sacrificial layer are removed together with any overlying material.

The resulting plurality of multi-layer thin film transistors is preferably in the form of an array which may in turn be formed into a display device by coupling each transistor in the array to a light-emitting cell.

15 Claims, 7 Drawing Sheets

Figure 1a - Mask forming on a multi-layer structure

Figure 1b - Etching

Figure 1c - Depositing dielectric

Figure 1d - Etching the dielectric continued ...

Figure 1e - Depositing conductive material

Figure 1f - Removing sacrificial layer

Figure 1g - Depositing semiconductor

Figure 4a - Mask forming on a multi-layer structure

Figure 4b - Etching

Figure 4c - Depositing dielectric continued ...

Figure 4d - Etching the dielectric

Figure 4e - Depositing conductive material

Figure 4f - Removing sacrificial layer

SELF-ALIGNING PATTERNING METHOD

The present invention relates to a self-aligning patterning method, particularly to such a method which is useful for the manufacture of a plurality of multi-layer thin film transistors on a substrate.

There is a desire to provide a low-cost, high-resolution patterning method which is capable of fabricating a plurality of multi-layer thin film transistors on a substrate. Such patterning has conventionally been carried out by using the technique of photolithography. Whilst this technique allows for very high resolution patterning, it requires the alignment of a photomask to fine structures that have previously been fabricated on the substrate. The photomask has typically to be aligned with the previously fabricated fine structures within a tolerance of about 0.1 µm otherwise the resulting transistors will not function as their components will not be correctly aligned. This need to achieve such a precise alignment is technically demanding as a consequence of which this alignment step represents a significant cost in the context of the manufacturing process as a whole. However, there is a constant pressure to reduce the costs of manufacturing processes for such advanced electronic products.

Alternative techniques which are being developed to carry out high-resolution patterning include micro-embossing, nano-imprinting and soft-contact printing. However, all of these techniques also require at some stage the precise alignment of a fabrication tool such as a photomask with previously fabricated fine structures in order to build up the layers of a multi-layer thin film transistor. Therefore these contemporary methods still cannot provide a low-cost, high-resolution patterning technique. It would be evidently desirable to devise a patterning method which does not need to include a step in which a photomask has to be accurately aligned with previously defined fine structures and which in particular can be used in the manufacture of a plurality of multiple multi-layer thin film transistors on a substrate.

A more specific problem arises in connection with the fabrication of a two-dimensional array of multiple thin film transistors over a large area on a flexible substrate. Such an array is useful as it can be used to manufacture display devices such as for mobile phones, televisions or computer screens having a size in principle of up to several square metres. If the array of transistors is formed on a flexible substrate, this would have the advantage of enabling production of the display device using a roll-to-roll fabrication technique; and with the additional advantage of ultimately providing a highly portable display device as this could for instance be rolled up when not in use.

In principle, the necessary array of thin film transistors can be formed using soft-contact printing or nano-imprinting techniques. However, these techniques can only define one layer of the device at a time such as the source and drain electrodes or the gate electrodes of the plurality of transistors. The fabrication of the subsequent layers of the thin film transistors would then require a step in which precise alignment with the earlier-formed electrode structures is necessary requiring a conventional photolithography step as discussed above. However in the case of a large area, flexible substrate, the necessary precise alignment is difficult to achieve even using photolithography due to the warping, thermal expansion or shrinking of the substrate. Additionally, the use of a roll-to-roll fabrication technique induces non-uniform distortions in the substrate due to the tension which has to be applied to the substrate when using this technique.

Accordingly, the present invention aims to tackle the above-mentioned problems associated with the need to employ multiple precise alignment steps in the manufacture of prior art arrays of thin film transistors. In particular, the present invention aims to provide a self-aligning patterning method capable of fabricating a plurality of multiple multi-layer thin film transistors on a substrate without the need to perform such precise alignment steps.

According to a first aspect, the present invention provides a self-aligning patterning method for use in the manufacture of a plurality of multi-layer thin film transistors on a substrate comprising the steps of:

(i) forming a patterned mask on the surface of a sacrificial layer which is part of a multi-layer structure which comprises in order the substrate, a conductive layer, an insulating layer and the sacrificial layer, the pattern of the mask determining the disposition of at least the gate electrodes of the multiple thin film transistors;

(ii) etching the unpatterned areas of the multi-layer structure so as to remove the corresponding areas of the sacrificial layer, the insulating layer and the conductive layer leaving voids;

(iii) depositing a layer of dielectric over the etched multi-layer structure to at least substantially fill the voids;

(iv) etching the deposited dielectric to at least partially expose the sides of the remaining areas of the sacrificial layer;

(v) depositing conductive material on the surface of the etched dielectric; and (vi) removing the remaining areas of the sacrificial layer together with any overlying material.

The term "sacrificial layer" used in the previous paragraph and elsewhere in this specification means a layer which is capable of being easily removed from the multi-layer structure of which it is a part in a relatively straight-forward manner such as by dissolving in an appropriate solvent, physically peeling it away or by etching using an appropriate etchant. The term "voids" used in the previous paragraph and elsewhere in this specification means gaps, cavities, hollows or any combination thereof which are empty volumes formed by etching away areas of the multi-layer structure unprotected by the mask. The term "in order" used in the previous paragraph and elsewhere in the same context in this specification means that the multi-layer structure comprises the substrate which in turn supports the conductive layer which in turn supports the insulating layer and which in turn supports the sacrificial layer. However, this is not intended to, nor does it, exclude the presence of one or more intervening layers between such layers.

The self-aligning patterning method of the present invention enables the manufacture of a plurality of multi-layer thin film transistors on a substrate without the need to align a photomask precisely with previously fabricated fine structures. In particular, the method provided by the present invention results in the appropriate alignment of the gate, source and drain electrodes in an array of fabricated thin film transistors by a self-alignment technique as described herein.

It is preferred that the substrate of the multi-layer structure should have sufficient flexibility to permit its use in a roll-to-roll fabrication method. In such a fabrication method, the substrate is initially provided in the form of a coiled roll. The substrate is unwound and subjected to various fabrication steps which include the manufacture of a plurality of multi-layer thin film transistors thereon before being wound back into a roll. Such a fabrication method is attractive from a processing viewpoint and permits the fabrication of large area display devices which can be transported in a rolled configuration rather than as a rigid flat screen, resulting in improved portability.

In one preferred aspect, the method further comprises the step of depositing a layer of semi-conductor material after step (vi) so as to form a plurality of bottom-gate thin film transistors. In this aspect, the gate electrodes of the transistors are derived from the conductive layer of the multi-layer structure whereas the source and drain electrodes are derived from the conductive material deposited in step (v).

In an alternative preferred aspect, the multi-layer structure used in step (i) further comprises a semiconductor layer between the substrate and the conductive layer so that the patterning method forms a plurality of top-gate thin film transistors. In this aspect, the conductive layer has to be discontinuous otherwise the source and drain electrodes of adjacent transistors would be electrically connected to each other. In this aspect, the source and drain electrodes are formed from the conductive layer of the multi-layer structure whereas the gate electrodes are formed from the conductive material deposited in step (v).

In the above two preferred aspects, the semiconductor material which is of course necessarily present in thin film transistors is an organic or inorganic semiconductor material. The use of an organic semiconductor material is advantageous in these aspects because organic materials are solution-processable. There is however a potential to also make inorganic semiconductor materials solution-processable, for instance by forming colloidal suspensions of silicon or converting organic semiconductor materials into inorganic semiconductor materials.

It is particularly preferred that the method of the present invention should be used to manufacture a plurality of thin film transistors in the form of a two-dimensional array whose area is at least $0.001$ m$^2$, more preferably at least $1$ m$^2$ and most preferably at least $3$ m$^2$. The transistors may be packed in such an array at a density of at least 1000 transistors/cm$^2$. In this case, a large area display device can be manufactured by coupling each transistor in the array to a light-emitting cell such as an organic light emitting diode.

Figure 2A:
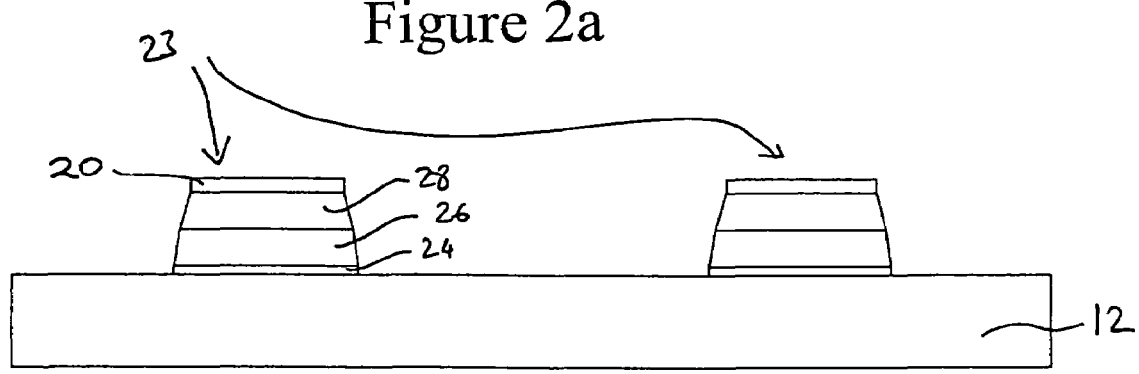
Figure 2B:
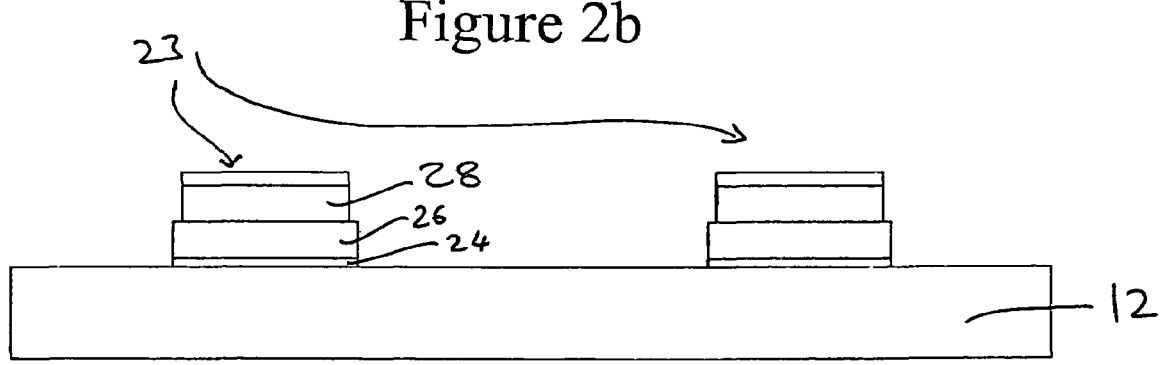
Figure 3:
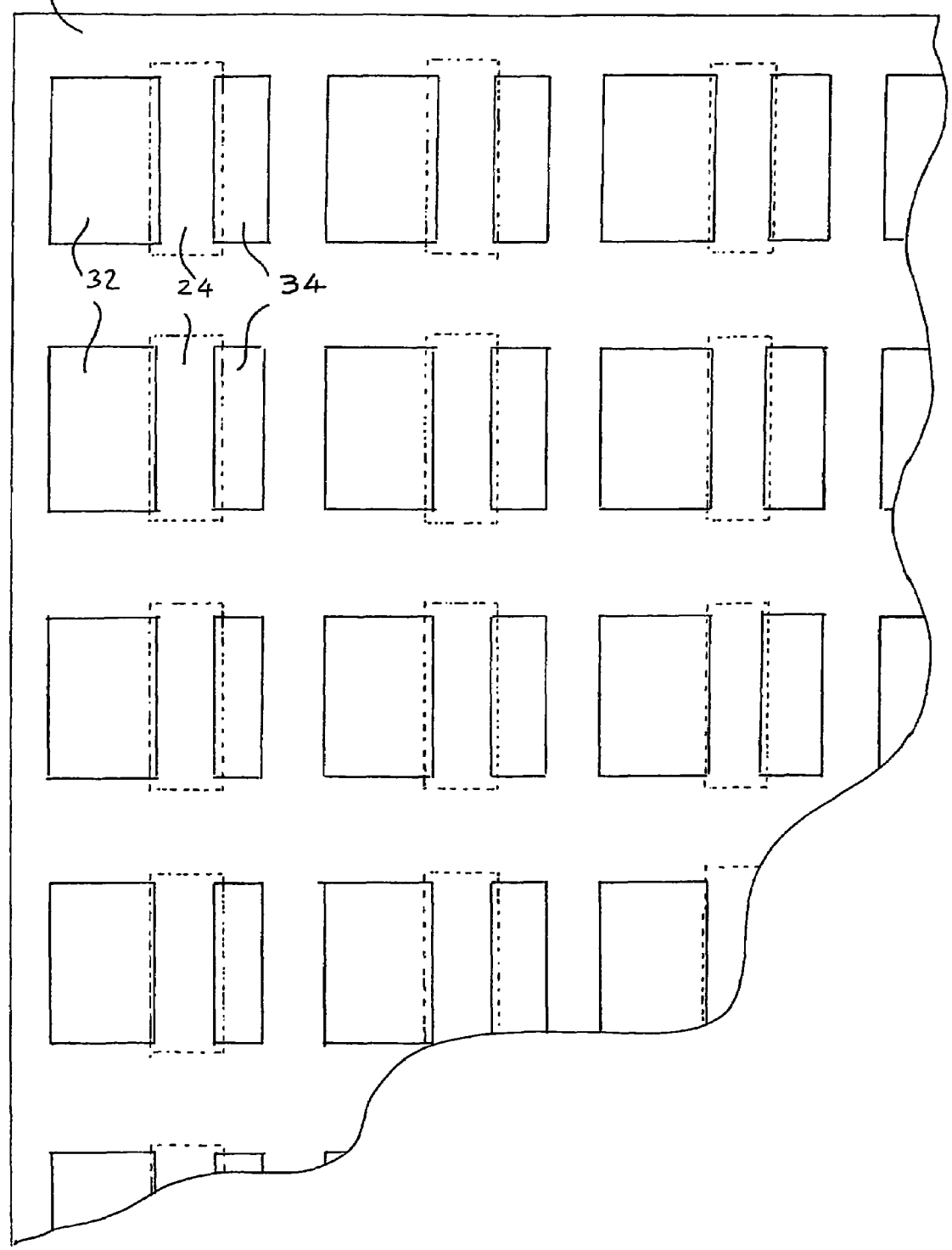
Figure 4:
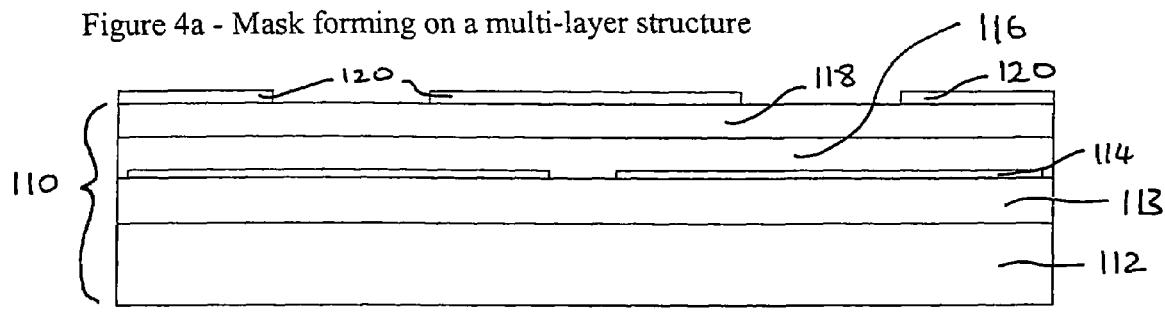
Figure 4:
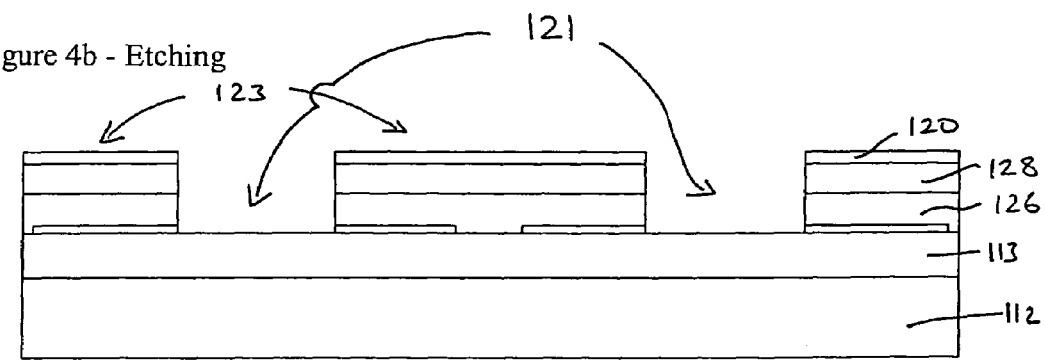
Figure 4:
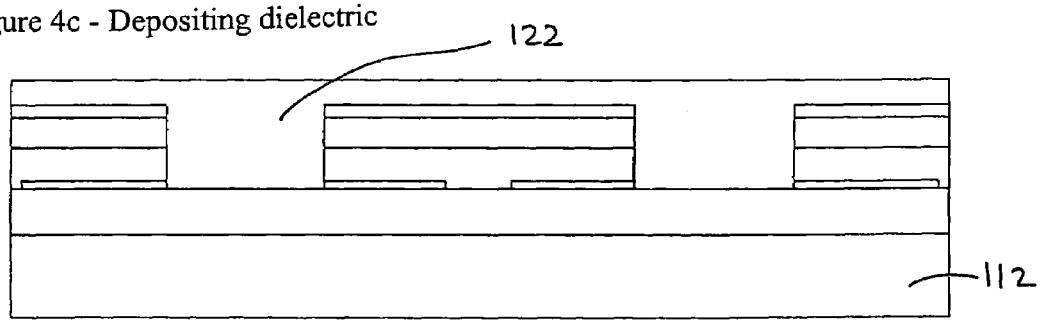
Figure 4:
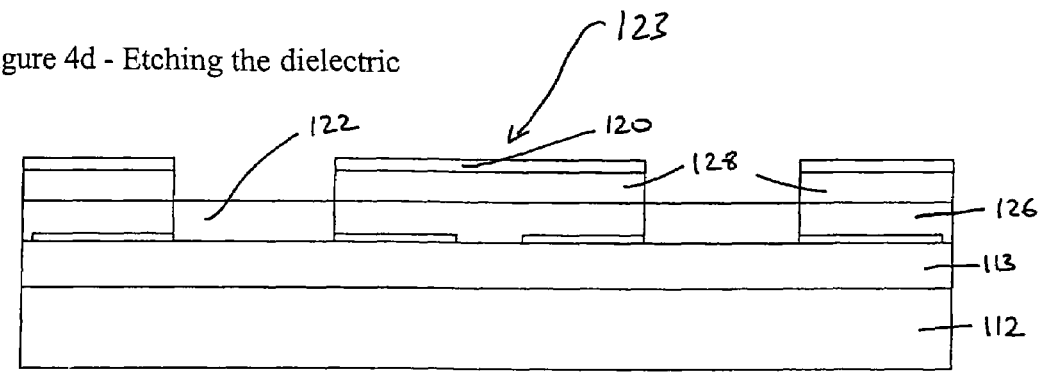
Figure 4:
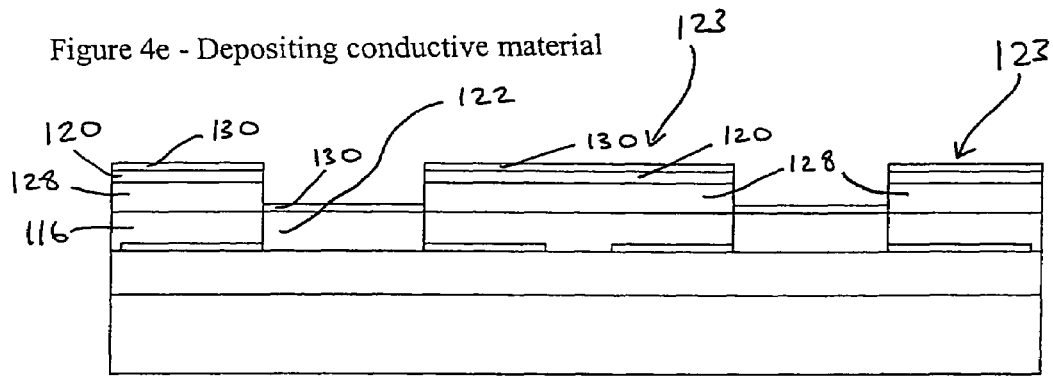
Figure 4:
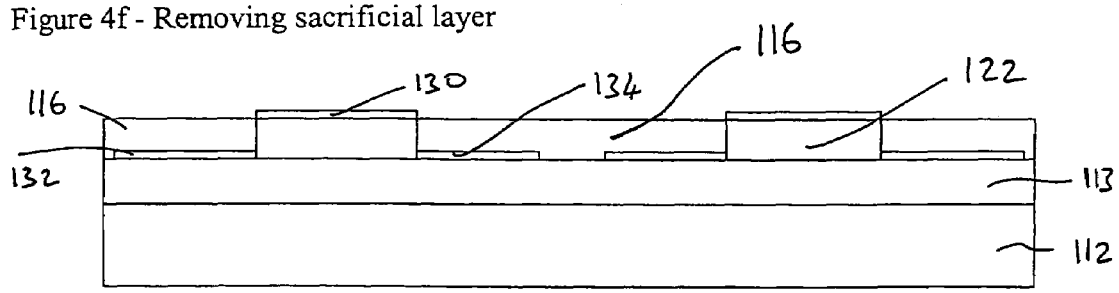
Figure 5:
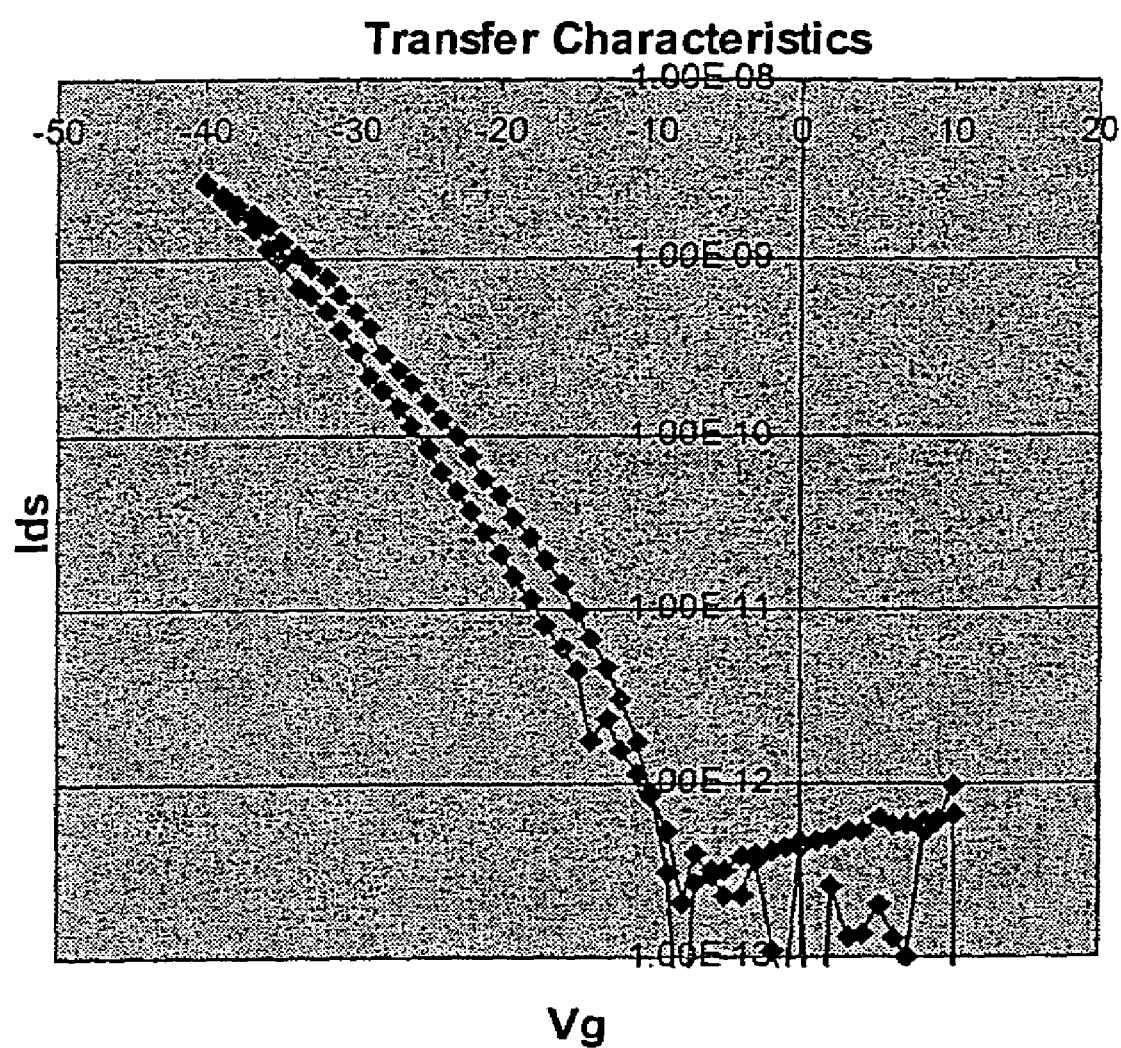

The present invention will now be described in further detail by reference to specific embodiments, an Example and the accompanying drawings in which:

FIG. 1 schematically illustrates the steps in cross-section of the present invention as part of the manufacture of two adjacent bottom-gate thin film transistors;

FIGS. 2a and 2b schematically illustrate in cross-section two alternative profiles to that illustrated in FIG. 1b which can be obtained following etching of the unpatterned areas of the multi-layer structure;

FIG. 3 schematically illustrates in plan view an array of bottom-gate thin film transistors produced in accordance with the method of the present invention;

FIG. 4 schematically illustrates the steps in cross-section of the present invention as part of the manufacture of two adjacent top-gate thin film transistors; and FIG. 5 is a graph illustrating the transfer characteristics of one of a plurality of multi-layer thin film transistors produced in accordance with the method of the present invention.

Turning firstly to FIG. 1, this schematically illustrates the steps in cross-section of the present invention as part of the manufacture of two adjacent bottom-gate thin film transistors. Thus FIG. 1a illustrates the formation of a patterned mask 20 on the surface of a sacrificial layer 18 which is part of a multi-layer structure 10. The multi-layer structure 10 comprises in order a substrate 12, a conductive layer 14, an insulating layer 16 and the sacrificial layer 18. The pattern of the mask 20 determines the disposition in the case of the fabrication of a plurality of bottom-gate thin film transistors of all of the source, drain and gate electrodes of the plurality of transistors.

The substrate 12 preferably has sufficient flexibility to enable it to be used in a roll-to-roll fabrication method. The substrate may be formed from a polymer such as a plastics. Examples of suitable plastics include polyethylene naphthalate (PEN) and polyethylene terephthalate (PET). On the other hand, the substrate used can be a conventional non-flexible substrate such as a glass sheet. Typically, the substrate has a thickness in the range 1 μm-10 mm, more preferably 10 μm-1 mm.

The substrate 12 is coated with a thin conductive layer 14 typically having a thickness of 5-200 nm, more preferably having a thickness 20-100 nm. The conductive layer may be formed from a metal such as aluminum, chromium, silver or gold, or any mixture thereof, by for instance thermal evaporation. The conductive layer 14 is over-coated with a layer of insulating material 16 such as a polyamide, polymethylmethacrylate, poly(4-methyl-1-pentene) or poly(4-vinylphenol). The insulating material can be deposited by spin-coating. The insulating layer typically has a thickness of 30 nm-2 μm, more preferably 50 nm-0.75 μm.

A sacrificial layer 18 is then deposited on the insulating layer 16 by for instance spin-coating. The sacrificial layer is formed from a substance which can be removed relatively easily from the multi-layer structure when required such as by dissolving in an appropriate solvent, physically peeling it away or by etching using an appropriate etchant. One possibility is to form the sacrificial layer from polymethylglutarimide (PMGI). A layer of this material can be removed by treatment with an aqueous alkaline solution. Other possible materials for forming the sacrificial layer include poly(4-vinylphenol) or polystyrene. The sacrificial layer is preferably 50 nm-1 μm thick, more preferably 0.1-0.7 μm.

In order to assist the adhesion of the sacrificial layer 18 to the insulating layer 16, the latter may first of all be activated to render it hydrophilic by for instance treating it with an oxygen plasma. This has the effect of generating many hydroxyl groups on the surface of the insulating layer if it is formed for instance from a polyamide.

The layers of the multi-layer structure may be deposited by several other techniques such as doctor-blading, screen-printing, offset-printing, flexo-printing, pad-printing, evaporation, sputtering, chemical vapour deposition, dip- or spray-coating and electroless plating. Of course, the deposition technique has to take into account the nature of the material being deposited and some of these techniques may not be applicable in the case of some materials and/or layers.

Next a patterned mask 20 is formed on the multi-layer structure 10. The pattern of this mask determines the disposition of the electrodes in the resulting plurality of thin film transistors. It will be recognized that the mask 20 need not be critically aligned with any pre-existing structure. The mask is typically 1 nm-1 μm thick, more preferably 10-100 nm thick. The width of the mask, indicated by "a" in FIG. 1a, determines the width of the gate electrode in the final transistor. Preferably this width is in the range 0.5-50 μm, more preferably 5-35 μm. As is well known to those skilled in the art, the width of the gate electrode should be minimized as far as possible to optimize the performance of the resulting transistor.

In one preferred embodiment, the mask is formed by firstly blanket-depositing a layer of germanium by evaporation on top of the sacrificial layer 18. Subsequently, a patterned masking layer is then formed from for instance poly(3,4-ethylenedioxythiophene)-polystyrenesulphonic acid (PEDOT:PSS)

by for instance ink-jet printing, photolithography, micro-embossing, nano-imprinting or soft-printing. Alternatively, the etch mask can be directly deposited as a pattern using shadow-mask evaporation of an oxygen plasma-resisting material such as a colloidal metal (e.g. silver) or a colloidal oxide (e.g. titanium dioxide). The mask may also be deposited by ink-jet printing. Suitable mask materials are generally those which have a lower etching rate when exposed to $CF_4$ plasma than germanium if this is first blanket-deposited.

The next step, which is illustrated in FIG. 1b, is to etch the multi-layer structure so as to remove the areas of the sacrificial layer corresponding to the unpatterned areas as well as the corresponding areas of the insulating layer and the conductive layer. This etching step leaves voids, indicated generally as 21, where the materials which have been etched away once existed. Where the mask is formed from PEDOT:PSS as described above, this etching can be performed firstly with $CF_4$ plasma which selectively removes unmasked germanium exposing the sacrificial layer 18. The sacrificial layer 18 and insulating layer 16 are then etched using for instance $O_2$ plasma thereby exposing the conductive layer 14. This is then etched using for instance MF-319 developer whose principal component is tetramethylammonium hydroxide. Other alkaline developers comprising sodium carbonate, sodium bicarbonate or sodium hydroxide could also be used for etching the conductive layer.

The etching step illustrated in FIG. 1b may be carried out using other techniques well known to those skilled in the art. These include laser ablation, corona discharge treatment, UV-ozone treatment, wet-chemical etching including solvent dissolution, or chemical dissolution.

The result of these etching steps is to form multi-layer stacks 23 comprising in order from the substrate 12 a layer 24 of conductive material, a layer 26 of insulating material, and a layer 28 of sacrificial material topped with the mask 20. In the precise embodiment described above, the layer of mask 20 will comprise a bottom thin layer of germanium and a top layer of PEDOT:PSS.

The next step, which is illustrated in FIG. 1c, is to at least substantially fill the voids 21 formed by the etching step with dielectric material 22. This can conveniently be done by overcoating the whole of the etched structure with a dielectric such as polymethylmethacrylate. Such a layer of dielectric can be deposited by spin-coating or ink-jet printing after which the deposited layer is flattened by mechanical compression against a suitable flat surface whilst being heated. A suitable surface is that of a silicon wafer. The heating temperature is selected depending upon the length of the molecular chains of the dielectric. For a polymer of a given type, polymers having a relatively short chain length have a relatively low glass transition temperature so that a relatively low temperature is needed to flatten the surface of a dielectric formed from such polymers. On the other hand, polymers of the same type but which have a relatively long chain length have a relatively high glass transition temperature so that flattening of a dielectric layer formed therefrom requires a higher temperature. Typically, the heating temperature is about 30-50° C. above the glass transition temperature of the dielectric material. If the dielectric is formed from polymethylmethacrylate, an appropriate temperature is about 170° C. for a molecular weight of 350,000 or 130° C. for a molecular weight of 150,000.

In FIG. 1c, the dielectric 22 is illustrated as not only filling the voids 21 but also covering the stacks 23. It is not however essential to deposit such a thick layer of dielectric. What is essential is that the layer of dielectric should be sufficiently thick that at least the layers 26 of insulating material of the stacks 23 are submerged by the dielectric. However, depositing the dielectric so that the resulting layer is precisely this thickness is difficult and it is much easier to deposit an excess of dielectric, as has been illustrated, so that it submerges the stacks 23.

The next step, which is illustrated in FIG. 1d, is to etch the dielectric 22 to expose at least part of the sides of the remaining areas 28 of the sacrificial layer. Ideally, the dielectric should be etched such that its top surface is approximately in line with the top surface of the insulating layers 26 of the stacks 23. This ensures that the sides of the sacrificial layers 28 are at least substantially exposed which facilitates their removal in a later step. Etching of the dielectric 22 to the appropriate thickness is readily achievable as existing techniques for plasma etching plastics such as polymethylmethacrylate are capable of etching to a desired thickness of ±1 µm.

The etching of the dielectric is preferably carried out by using oxygen plasma. It should be noted that this etching step also removes the dielectric 22 from above the stacks 23 but does not penetrate through the masks 20 on top of the stacks. As a consequence, the stacks 23 remain intact after this etching step.

The next step, which is illustrated in FIG. 1e, is to deposit conductive material 30 around each of the stacks 23. Thus conductive material is deposited at both sides of each stack and also (incidentally) on their tops. This conductive material in due course forms the source and drain electrodes of the transistor. Typically the conductive material 30 may be deposited by thermal evaporation of metal or by ink-jet printing of a solution containing colloidal particles of metal in a suitable dispersant. The thickness of the resulting conductive layer 30 is preferably 10-100 nm. It may be formed from such metals as chromium, aluminum, gold, silver, copper, nickel, or any combination thereof.

It will be noted that the conductive layer 30 cannot be deposited as a blanket layer across the entire etched dielectric. This is because such a blanket-deposited conductive material would not form separate source and drain electrodes for adjacent transistors. Therefore the conductive material 30 must be deposited selectively. This can readily be achieved by ink-jet printing of colloidal metal particles which can typically produce droplet sizes of as low as 30 µm although it is expected that further development of ink-jet printing techniques will reduce the smallest droplet size to 5-10 µm in the near future. In the case of a display, the intrinsic footprint of a whole thin film transistor can typically be a few tens of micrometers square. Accordingly, droplets which are produced by ink-jet printing are capable of depositing the colloidal metal particles in the desired locations relative to the stacks 23 as illustrated in FIG. 1e.

The next step, which is illustrated in FIG. 1f, is to remove the residual sacrificial layers 28 by for instance peeling them off or by dissolving them away with a suitable solution. If the sacrificial layer is formed from PMGI, then the sacrificial layers 28 can be removed by treatment with an alkaline developer such as potassium hydroxide, sodium hydroxide or sodium alkylarylsulfonate. This removal step can be assisted by for instance performing it in an ultrasonic bath. It is also known in this technology to form sacrificial layers from for example poly(4-vinylphenol) or polystyrene which can be easily washed away using an organic solvent such as acetone or ethanol.

The removal of the sacrificial layers 28 also removes overlying materials such as the mask 20 and conductive material 30 which are on the top of the stacks 23 being supported by the sacrificial layers 28. The removal of the sacrificial layers thus divides the conductive material 30 previously deposited into discrete areas 32 and 34 which respectively form the drain and source electrodes of the eventual transistors.

As a final step illustrated in FIG. 1g, a layer of semiconductor 36 is then coated by for instance spin-coating to bridge the source and drain electrodes in order to complete the fabrication of the plurality of multi-layer thin film transistors. Thus each of the transistors includes a drain electrode 32, a source electrode 34 and a gate electrode 24. The semiconductor material may be an organic semiconductor such as 3-hexylthiophene (P3HT) or polyarylamine (PAA). The layer of the semiconductor is typically 10-300 nm thick, preferably 20-150 nm. It will be appreciated that because the layer 36 is formed from semiconductor, it does not short circuit the electrodes of adjacent transistors so avoiding cross-talk between adjacent transistors.

As is well known to those skilled in the art, it is advantageous if the gate electrode slightly underlies the source and drain electrodes at their edges. Thus in the case of a bottom-gate transistor such as produced in accordance with the method set out in FIG. 1, it is advantageous that the drain and source electrodes 32, and 34 are arranged such that a small edge portion of them lies directly above the gate electrode 24. Such an arrangement is readily realized in accordance with the present invention as a consequence of the usual profile which results from plasma etching. Such a profile is shown, in exaggerated fashion, in FIG. 2a. This illustrates adjacent stacks 23 formed on a substrate 12. Each stack includes a conductive layer 24, an insulator layer 26, a sacrificial layer 28 and a mask 20. This Figure illustrates the slightly sloping profile of the stacks 23 which results from plasma etching. This profile has the consequence that after the steps of filling with dielectric, etching the dielectric and then depositing the conductive material, some of the conductive material will lie directly above the conductive layer 24 which becomes the gate electrode. The extent of this overlap can be controlled by a suitable choice of materials forming the insulating layer 26 and sacrificial layer 28. If the material forming the sacrificial layer 28 is more easily etched than the material forming the insulating layer 26 by plasma, then the resulting etching profile of the stacks would assist in realizing an overlap between the gate and source-drain electrodes.

An alternative way in which the source and drain electrodes can be arranged to slightly overlie the gate electrode is by de-wetting the stacks 23, and this is illustrated in FIG. 2b. In this Figure, it can be seen that the sacrificial layers 28 in the stacks 23 have been shrunk as compared to the width of the insulator layer 26 and conductive layer 24. This can be achieved by annealing the stacks 23 at a temperature above the glass transition point of the material forming the sacrificial layers 28 but at which the materials forming the insulating and conductive layers 26, 24 are dimensionally stable. It will then be understood by comparing FIG. 2b with FIG. 1 that the resulting de-wetted stacks will ultimately result in the drain and source electrodes slightly overlying the gate electrode 24.

This is schematically illustrated in FIG. 3 which is a plan view of an array of bottom-gate thin film transistors produced as described above. The array comprises multiple transistors, each including a drain electrode 32, a gate electrode 24 and a source electrode 34. Whilst the drain and source electrodes 32 and 34 are shown by solid lines, these electrodes are beneath a top layer 36 of semiconductor. Firstly, it will be seen that the drain electrode 32 in this embodiment is dimensionally larger than the source electrode 34. There is no reason for the drain and source electrodes to be the same size. In fact it is advantageous that one of these electrodes, in this case the drain electrode 32, is larger if the drain electrodes are eventually all coupled to light-emitting cells in a display device fabricated from the array of transistors.

It will further be seen that the drain and source electrodes 32 and 34 slightly overlie the gate electrode 24. This slight overlie, as previously mentioned, leads to improved transistor performance. If there is too much overlap however, then the resistance between the source and gate electrodes breaks down leading to an unacceptably high leakage current between them. In fact the optimum amount of overlap occurs when this is about equal to the vertical separation between the gate electrode 24 and the source and drain electrodes 32 and 34.

The method of the present invention will now be further explained in connection with the fabrication of a plurality of top-gate thin film transistors with reference to FIG. 4. This Figure schematically illustrates the steps in cross-section of the present invention as part of the manufacture of two adjacent top-gate thin film transistors. Thus FIG. 4a illustrates a patterned mask 120 on the surface of a sacrificial layer 118 which is part of a multi-layer structure 110. The multi-layer structure 110 comprises in order a substrate 112, a semiconductor layer 113, a discontinuous layer of conductive material 114, an insulting layer 116 and the sacrificial layer 118. The pattern of the mask 120 determines the disposition in the case of the fabrication of a plurality of top-gate thin film transistors of the gate electrode of the plurality of transistors and also the lateral extent of the source and drain electrodes.

The various layers of the multi-layer structure 110 are generally the same as those described in connection with FIG. 1 apart from the following. Firstly, a layer of semiconductor material 113 is deposited between the (discontinuous) conductive layer 114 and the substrate 112. The semiconductor layer may be formed from an organic semiconductor such as P3HT or PAA. Typically it is 10-300 nm thick, preferably 20-150 nm thick.

A discontinuous layer of conductive material 114 is deposited on the semiconductor layer 113. The conductive layer is typically 5-200 nm thick, more preferably 20-100 nm thick. The conductive layer 114 is deposited preferably by means of ink-jet printing on the semiconductor layer 113. The conductive material is printed in approximately rectangular shapes with each rectangle eventually providing the source electrode of one transistor and the drain electrode of an adjacent transistor. The reason that a continuous conductive layer cannot be deposited at this stage is that this would result in adjacent transistors having electrodes that are directly electrically connected, which must of course be avoided. The insulating layer and sacrificial layer of the multi-layer structure are as explained in connection with FIG. 1.

The mask 120 can also be formed in much the same way as the mask 20 as described in connection with FIG. 1. However, the mask has to be patterned in rough alignment with the pattern of the rectangles of the conductive material 114 as is illustrated in FIG. 4a. It is particularly important that the openings in the mask should lie above the areas of the conductive layer 114 as these openings define the separation of the source-drain and gate length.

The next step, which is illustrated in FIG. 4b, is to etch the multi-layer structure so as to remove the areas of the sacrificial layer 118 corresponding to the unpatterned areas as well as the corresponding underlying areas of the insulating layer 116 and the conductive layer 114. This etching step leaves voids 121 where the materials which have been etched away once existed. The etching can be carried out in the same manner as described in connection with FIG. 1b. This etching should however not disturb the semiconductor layer 113 so the etching means must be appropriately selected with this in mind.

The result of etching is to form multi-layer stacks 123 comprising in order from the substrate 112 and semiconductor 113, partial layers of conductive material, a layer 126 of insulating material and a layer 128 of sacrificial material topped with the mask 120.

The next step, which is illustrated in FIG. 4c, is to at least substantially fill the voids 121 formed by the etching step with dielectric material 122. This can be done in the same way as described in connection with FIG. 1c.

The next step is to etch the dielectric 122 to expose at least part of the sides of the remaining areas 128 of the sacrificial layer. Ideally, the dielectric should be etched such that its top surface is approximately in line with the top surface of the insulating layer 126 of the stacks 123. This ensures that the sides of the sacrificial layers 128 are at least substantially exposed by this etching step in order to enable their removal in a later step. The etching can be carried out in the same manner as described in connection with FIG. 1d.

The next step, which is illustrated in FIG. 4e, is to deposit a layer of conductive material 130 on to the surface of the etched dielectric 122. The conductive material may also be deposited during this step on top of the mask 120. Typically the conductive material 130 can be deposited by thermal evaporation of metal. There is no need to ensure that the conductive material is deposited in discrete areas in this embodiment as all the unwanted conductive material is removed at the same time as the removal of the sacrificial layer in the next step.

The next step, which is illustrated in FIG. 4f, is the removal of the residual sacrificial layers 128 by for instance peeling them off or by dissolving them away with a suitable solvent as is explained in connection with FIG. 1f.

The removal of the sacrificial layers 128 also removes overlying materials such as the mask 120 and conductive material 130 which are on the top of the stacks 123. The removal of the sacrificial layers 128 results directly in the fabrication of the transistors. Thus each transistor includes a drain electrode 132, a source electrode 134 and a gate electrode 130. The drain and source electrodes 132, 134 are formed from the conductive layer 114 whereas the gate electrode 130 is formed from the conductive material 130 deposited in the previous step.

The method of the present invention as explained above results in the fabrication of an array of thin film transistors on a substrate. Such an array may in turn be converted into a display device by coupling for instance the drain electrode of each transistor to a respective light-emitting cell such as an organic light-emitting diode.

It is important to note that in the self-aligning patterning method provided by the present invention, the various layers of an array of thin film transistors are fabricated by self-alignment without the need for a step requiring precise alignment such as photolithography. More preferably, this method can be combined with ink-jet printing to deposit materials locally to fabricate large area display devices by a roll-to-roll process.

The invention will now be further explained by reference to the following Example.

EXAMPLE

The self-aligning patterning method of the present invention was used to fabricate an array of bottom-gate thin film transistors on a substrate.

Firstly a 40 nm thick layer of aluminum 14 was evaporated onto a glass substrate 12. Then a 500 nm thick layer of polyamide 16 was spin-coated on the aluminum coated glass substrate. This film was baked at 240° C. for 15 minutes. The polyamide was then activated by subjecting it to an oxygen plasma by a flow of the plasma-generating gas at 200 ml/minute with an etching power of 100 watts. This renders the polyamide hydrophilic by generating hydroxyl groups on its surface thereby facilitating the adhesion of the sacrificial layer on the polyamide surface.

Then a 500 nm thick layer of PMGI 16 was spin-coated on top of the plasma-treated polyamide. The resulting structure was then baked at 220° C. for 10 minutes.

Then a layer of 10 nm of germanium was thermally evaporated on top of the PMGI film. This was followed by ink-jet printing a water-based PEDOT:PSS solution in a pattern to form the mask 20. In order to obtain a wettable surface for ink-jet printing of the PEDOT:PSS solution, an approximately 5 nm layer of poly(4-vinylphenol) was spin-coated on the germanium layer.

The resulting structure was then etched firstly with $CF_4$ at a gas flow rate of 150 ml/minute at a power of 200 watts which etches away the unmasked germanium layer. This etching was carried out for 1 minute. Secondly oxygen plasma at a gas flow rate of 300 ml/minute at a power of 300 watts was used to etch the PMGI and polyamide layers. Thirdly, the uncovered areas of the aluminum film were then etched away using MF-319 which is essentially an aqueous solution of tetramethylammonium hydroxide. This etching was carried out for about 3 minutes at room temperature.

The resulting sample was cleaned in water and then dried, after which a 1 μm thick layer of polymethylmethacrylate 22 was spin-coated thereon followed by baking at 160° C. for 5 minutes. Then the sample was mechanically pressed against a silicon wafer surface at 170° C. in order to flatten the spin-coated polymethylmethacrylate layer to ensure that it filled all the voids 21 left by the etching step.

Oxygen plasma was then used to etch the polymethylmethacrylate layer in order to expose the sacrificial PMGI layer. The etching parameter is selected according to the thickness of the polymethylmethacrylate layer. For a patterned line array structure, the etching parameter $\Delta$ is calculated by the equation $\Delta = t - h(T-a)/T$ where t is the thickness of the polymethylmethacrylate layer, h is the total thickness of the PMGI and polyamide layers, "a" corresponds to the dimension as illustrated in FIG. 1a and T is the period of the structure corresponding to the sum of "a" plus the distance separating adjacent stacks 23. The polymethylmethacrylate was etched until the PMGI was fully exposed.

A 25 nm layer 30 of gold and a 5 nm buffer layer of chromium were then deposited by thermo-evaporation through an aluminum foil perforated with appropriately arranged and sized openings. The sacrificial layer of PMGI was then dissolved away using an aqueous solution of potassium hydroxide with the assistance of an ultrasonic bath. Finally a 100 nm thick layer of polyarylamine 36, an organic semiconductor, was spin-coated on the surface and the sample finally baked at 80° C. for 30 minutes.

The transistor characteristics of one of the resulting transistors was then analysed using an Agilent 4156C analyser. The results are illustrated in FIG. 5 in the case of measurements taken at a $V_{DS}$ of −5V.

The invention claimed is:
1. A method of forming a transistor, comprising:
forming a first conductive layer over a substrate;
forming a first insulating layer over the first conductive layer;

forming a second insulating layer over the first insulating layer;

forming a mask over a first portion of the second insulating layer, the mask being positioned above a first portion of the first insulating layer, the first portion of the second insulating layer and a first portion of the first conductive layer;

removing a second portion of the first insulating layer, a second portion of the second insulating layer, and a second portion of the first conductive layer;

forming a third insulating layer over the mask, the third insulating layer covering the first portion of the first insulating layer, the first portion of the second insulating layer, the first portion of the first conductive layer, and the substrate;

removing a first portion of the third insulating layer in order to make a second portion of the third insulating layer remain over the substrate;

forming a second conductive layer over the mask and the second portion of the third insulating layer, a first portion of the second conductive layer being overlapped with the mask, a second portion of the second conductive layer being positioned above the second portion of the third insulating layer;

removing the first portion of the second insulating layer, the mask and the first portion of the second conductive layer; and forming a semiconductor layer over the first portion of the first insulating layer and the second portion of the second conductive layer.

2. The method according to claim 1, the semiconductor layer being formed from an organic semiconductor.

3. The method according to claim 1, in the step of removing the first portion of the third insulating layer, a top surface of the second portion of the third insulating layer being approximately in line with a surface between the first portion of the first insulating layer and the first portion of the second insulating layer.

4. The method according to claim 1, the substrate being formed from a polymer.

5. The method according to claim 1, the first insulating layer being formed from a first material and the second insulating layer being formed from a second material, the first and second materials being different.

6. The method according to claim 5, the second material being dissolved in an aqueous alkaline solution.

7. The method according to claim 6, the first portion of the second insulating layer being removed by treatment with an aqueous alkaline solution.

8. The method according to claim 1, the mask being formed by inkjet printing.

9. The method according to claim 1, each of the first, second and third insulating layers including a polymer material.

10. The method according to claim 1, the first portion of the first conductive layer being configured to work as a gate electrode.

11. The method according to claim 1, the second portion of the second conductive layer being configured to work as one of a source and drain electrodes.

12. The method according to claim 1, the first portion of the first insulating layer being configured to work as a gate insulating layer.

13. A method of forming an organic light-emitting diode, the method comprising:
    forming a transistor according to claim 1.

14. A method of forming a display device, the method comprising:
    forming a transistor according to claim 1.

15. A method of forming a transistor, comprising:
    forming a semiconductor layer over a substrate;
    forming a first conductive layer over the semiconductor layer;
    forming a first insulating layer over the first conductive layer;
    forming a second insulating layer over the first insulating layer;
    forming a mask over a first portion of the second insulating layer, the mask being positioned above a first portion of the first insulating layer, the first portion of the second insulating layer and a first portion of the first conductive layer;
    removing a second portion of the first insulating layer, a second portion of the second insulating layer, and a second portion of the first conductive layer;
    forming a third insulating layer over the mask, the third insulating layer covering the first portion of the first insulating layer, the first portion of the second insulating layer, the first portion of the first conductive layer, and the substrate;
    removing a first portion of the third insulating layer in order to make a second portion of the third insulating layer remain over the substrate;
    forming a second conductive layer over the mask and the second portion of the third insulating layer, a first portion of the second conductive layer being overlapped with the mask, a second portion of the second conductive layer being overlapped with the second portion of the third insulating layer; and
    removing the first portion of the second insulating layer, the mask and the first portion of the second conductive layer.

* * * * *